United States Patent [19]
Watanabe et al.

[11] Patent Number: 5,930,132
[45] Date of Patent: Jul. 27, 1999

[54] SEMICONDUCTOR DEVICE, AND METHOD AND APPARATUS FOR REDUCING A DEAD TIME IN PWM INVERTER

[75] Inventors: Kazuo Watanabe; Atsushi Sato, both of Yokohama, Japan

[73] Assignee: Kabushiki Kaisha Wacogiken, Kanagawa, Japan

[21] Appl. No.: 09/114,275

[22] Filed: Jul. 13, 1998

[30] Foreign Application Priority Data

Jul. 16, 1997 [JP] Japan ................................. 9-191114

[51] Int. Cl.⁶ ........................... H02M 7/122; H02M 1/12
[52] U.S. Cl. ............................................. 363/56; 363/41
[58] Field of Search ............................... 363/41, 50, 55, 363/56, 97, 98, 131, 132

[56] References Cited

U.S. PATENT DOCUMENTS

| | | | |
|---|---|---|---|
| 5,414,341 | 5/1995 | Brown | 323/268 |
| 5,488,258 | 1/1996 | Honda | 307/64 |
| 5,671,131 | 9/1997 | Brown | 363/56 |

*Primary Examiner*—Matthew Nguyen
*Attorney, Agent, or Firm*—Wenderoth, Lind & Ponack, L.L.P.

[57] ABSTRACT

In a PWM inverter having a two-arm structure of upper and lower arms, the dead time is reduced to a minimum for improving the controlling accuracy and linearity under a very small rate of the inverter power output. Also, in the PWM control on a motor, the controlling stability at a lower speed can be increased. Particularly, an improvement for use in a PWM inverter comprises off-state detecting means, each connected to a power switching element in one of the two upper and lower arms of the PWM inverter for detecting the off-state of the switching element and gate means, each provided for receiving an off-state detection signal fed back from the off-state detecting means of the opposite arm connected to the input of corresponding one of the two switching elements and generating a turn-on signal for the other switching element.

16 Claims, 9 Drawing Sheets

SEMICONDUCTOR DEVICE, AND METHOD AND APPARATUS FOR REDUCING A DEAD TIME IN PWM INVERTER

BACKGROUND OF THE INVENTION

1. Field of the Invention

The present invention relates to improvement of a semiconductor device for switching of power. It also relates to a method and an apparatus for reducing a dead time to improve the accuracy and steadiness of controlling the order of low current and low voltage/low power which may affect the efficiency of inversion in a PWM (Pulse Width Modulation) converter composed of a circuit having two, upper and lower, arms.

2. Description of the Related Art

Such a PWM inverter as having two, upper and lower, arms is commonly used in a motor drive, an audio apparatus (a class-D power amplifier), or any other electrical appliances which include a pair of switching elements (e.g. transistors, FETS, IGBTS, or other semiconductor devices) connected in a series combination to a DC power source of 100 to 400 volts. In particular, the period for energizing the switching elements is controlled by on/off actions to provide a desired rate of voltage or current. However, if the two switching elements connected in series are simultaneously turned on, they are shortcircuited to the DC power source. Thus, it will receive an overcurrent resulting in breakdown.

It is known that a typical semiconductor switching element has an intrinsic time interval from the receipt of an on or off control signal to the starting up of its switching action. The action of the switching elements is normally faster for turning on than turning off. Also, the duration of action of a drive circuit depends on its characteristics. Accordingly, when one of the two switching elements in the upper or lower arm is turned off and simultaneously, the other switching element is turned on without giving a delay (a dead time), an instantaneous shortcircuit may be produced. To avoid such a shortcircuit, the drive circuit for the switching elements is preset unconditionally and perpetually with a dead time (a safety waiting time) of 3 to 6 microseconds which is determined in consideration of differences between the delays which are intrinsic to the elements and circuits and which are used for disabling the two switching elements. More specifically, since a conventional method and an apparatus for setting the dead time unconditionally and perpetually have to take into account variations in the operating time of the switching elements and in the temperature of use, the dead time is set to a considerable length, hence, impairing the linear control under low power ranges.

In the conventional method, it is desired to set the dead time to a length longer than a maximum time (toffmax) of the switching period of the switching element unconditionally and perpetually. For control under a very small power, the switching element has to be turned on and off at the shortest possible interval. A pulse width modulated (PWM) signal may be concealed within the dead time and fail to carry out a control action thus causing non-linear operation under the very small power. The non-linear operation will generate unwanted high-frequency noise in the output of the circuit.

SUMMARY OF THE INVENTION

The present invention has been developed in view of the above aspects and its objective is to provide an apparatus and a method for decreasing the dead time as close as zero to allow for linear control under a very small power by detecting the off-state of each switching element in one arm directly or indirectly and feeding it back to a corresponding gate input in the opposite arm.

To achieve the objectives of the present invention, a dead time reducing apparatus for use in a PWM inverter comprises off-state detecting means, each connected to a power switching element in one of the two upper and lower arms of the PWM inverter for detecting the off-state of the switching element and gate means, each provided for receiving an off-state detection signal fed back from the off-state detecting means of the opposite arm connected to the input of corresponding one of the two switching elements and generating a turn-on signal for the other switching element.

Also, a method of reducing a dead time in a PWM inverter which has a two-arm structure of upper and lower arms, according to the present invention, is provided comprising the steps of judging the off-state of a power switching element in one of the two upper and lower arms, transmitting an off-state detection signal indicative of the off-state of the switching element to the input of a gate in the opposite arm, and generating and delivering a turn-on signal to a corresponding switching element in the opposite arm in response to the off-state of the switching element of the one arm received at the input of the gate.

Moreover, a semiconductor device for power switching according to the present invention is characterized by off-state detecting means for detecting and delivering the off-state of corresponding one of the power switching elements to the outside, each connected in parallel with the corresponding switching element.

DESCRIPTION OF THE PREFERRED EMBODIMENTS

Preferred embodiments of the present invention will be described referring to the accompanying drawings.

Figure 1:
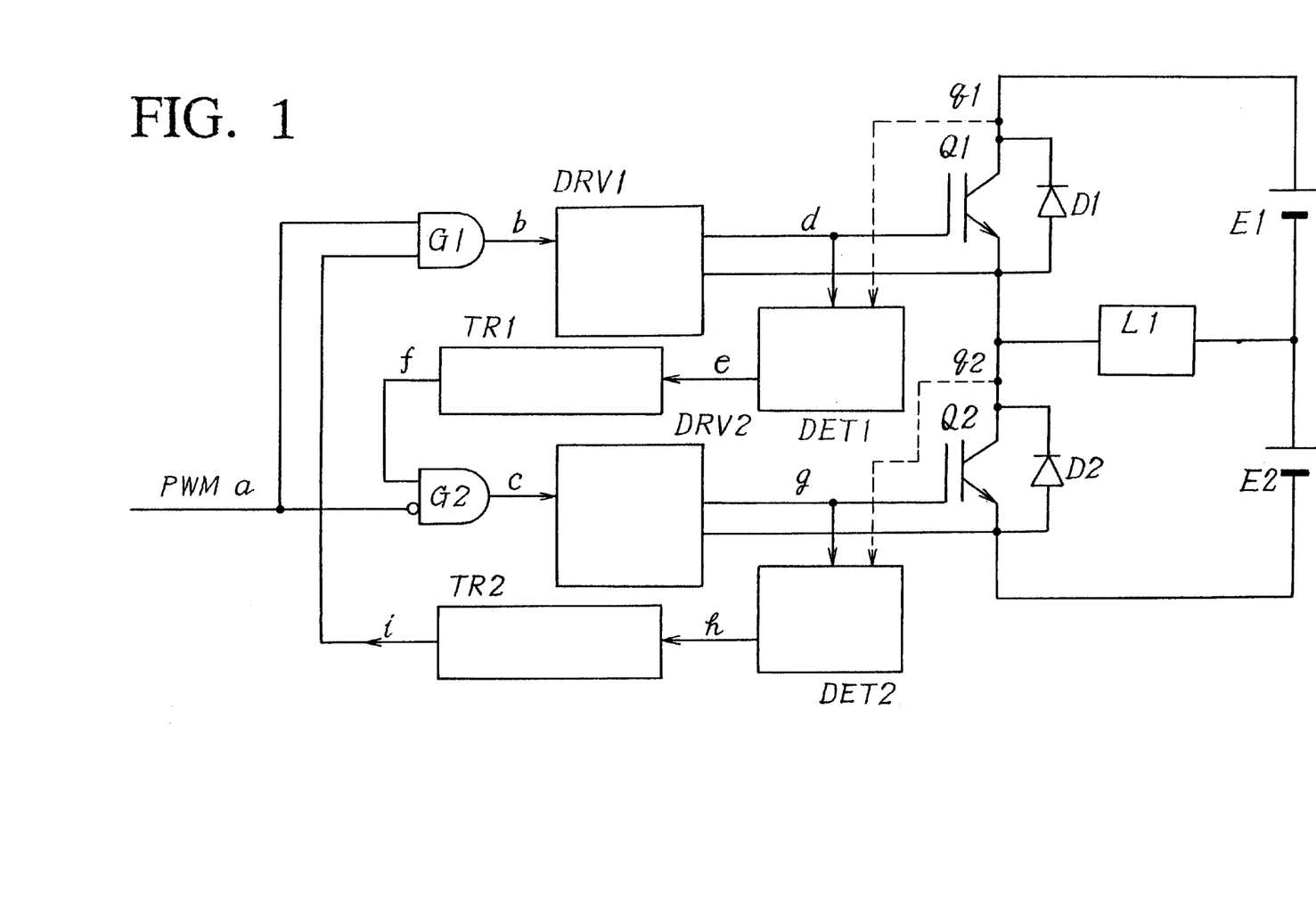
FIG. 1 is a block diagram of an arrangement according to the present invention.
Figure 2A:
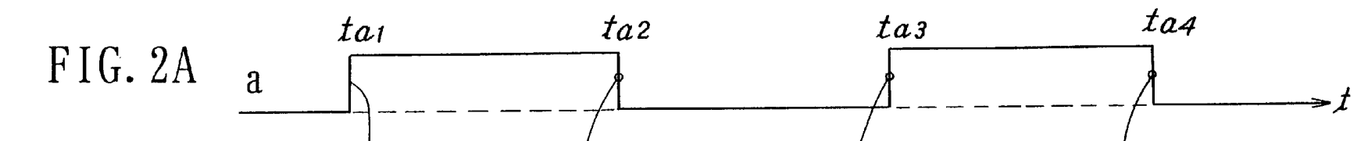
FIGS. 2A to 2E are time charts showing an operation of the arrangement, respectively.
Figure 2B:
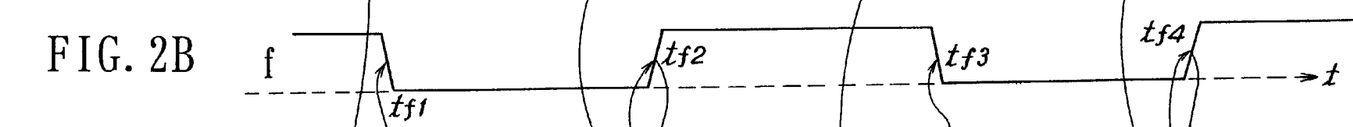
Figure 2C:
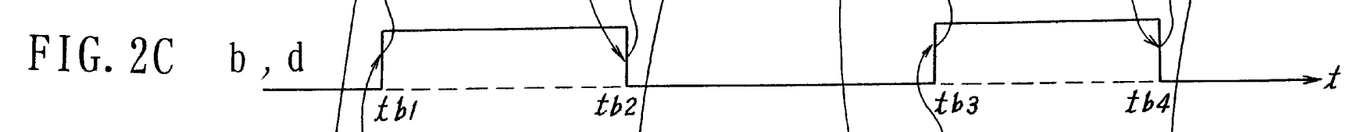
Figures 2D, 2E:
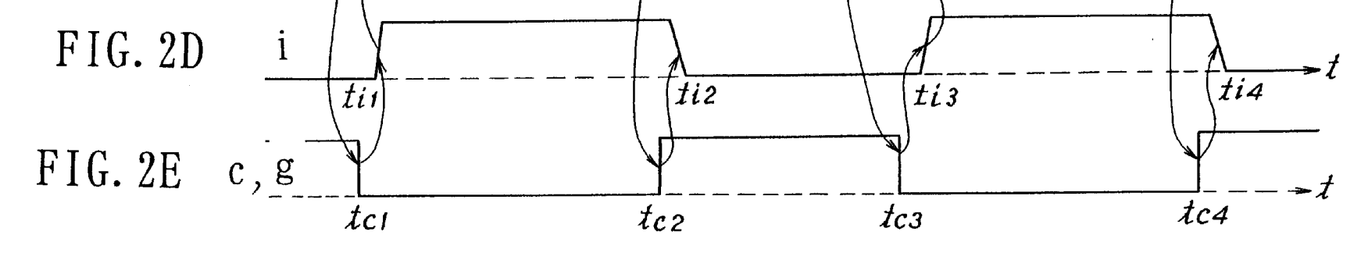

FIG. 1 is a functional block diagram explaining the principle of operation according to the present invention in which a load L1 and a couple of electrical sources E1 and E2 are connected in series to the two upper and lower arm arrays of switching elements Q1, D1, Q2 and D2. A pair of gates G1 and G2 are provided for receiving, at one of the two inputs, a PWM signal a for driving the switching elements Q1 and Q2, respectively, and then delivering output signals b and c via gate drive circuits DRV1 and DRV2 to the switching elements Q1 and Q2, respectively. An off-state detecting means DET1 is provided for receiving a gate signal d or an output signal q1 from the switching element Q1 and then delivering an output signal e via a signal transferring means TR1 such as a photo-coupler or a pulse transformer to the other input of the gate G2 of the opposite arm. Similarly, an off-state detecting means DET2 is provided for receiving a gate signal g or an output signal q2 from the switching element Q2 and then delivering an output signal h via a signal transferring means TR2 to the other input of the gate G1 of the opposite arm.

An operation in the arrangement of FIG. 1 is explained by the time charts shown in FIGS. 2A to 2E. When the PWM signal a (FIG. 2A) rises to the high level at the timing ta1, the output signal c (FIG. 2E) of the gate G2 is shifted to the low level or an off-state after a short length of time, thus turning the output signal g (FIG. 2E) of a gate drive circuit DRV2 to the low level. This causes the off-state detecting means DET2 to detect the off-state of the switching element Q2 and causes the transferring means TR2 to deliver an off signal i (FIG. 2D) of the switching element Q2 to the AND gate G1 which in turn drives the gate drive circuit DRV1 at the timing tb1 to turn on the switching element Q1. More particularly, upon the off-state of the switching element Q2 being detected, the switching element Q1 is supplied with the on signal. Accordingly, it is unnecessary to have a dead time for preventing the simultaneous turn-on actions of the two elements Q1 and Q2.

When the PWM signal a is shifted at the timing ta2 to the low level, the off signal b (FIG. 2C) for turning off the switching element Q1 is delivered from the gate G1 and the drive circuit DRV1. Upon the off-state detecting means DET1 detecting the off-state of the switching element Q1, the transferring means TR1 delivers an off signal f (FIG. 2B) to the AND gate G2 which in turn releases the on signal c. Accordingly, the gate drive circuit DRV2 delivers the signal g to turn on the switching element Q2. More particularly, upon the off signal f, indicative of the off-state of the switching element Q1, being detected, the switching element Q2 is supplied with the on signal g, whereby such a dead time for preventing the simultaneous turn-on actions of the two elements Q1 and Q2 will be eliminated. It is feasible in the current technology of semiconductor elements that each of the interval (expressed by the timings tb1–ta1) from the rise of the signal a to the decay of the gate signal d for the switching element Q1 and the interval (expressed by the timings tc2–ta2) from the decay of the signal a to the rise of the gate signal g for the switching element Q2 is set to 1 microsecond or shorter.

Figure 3:
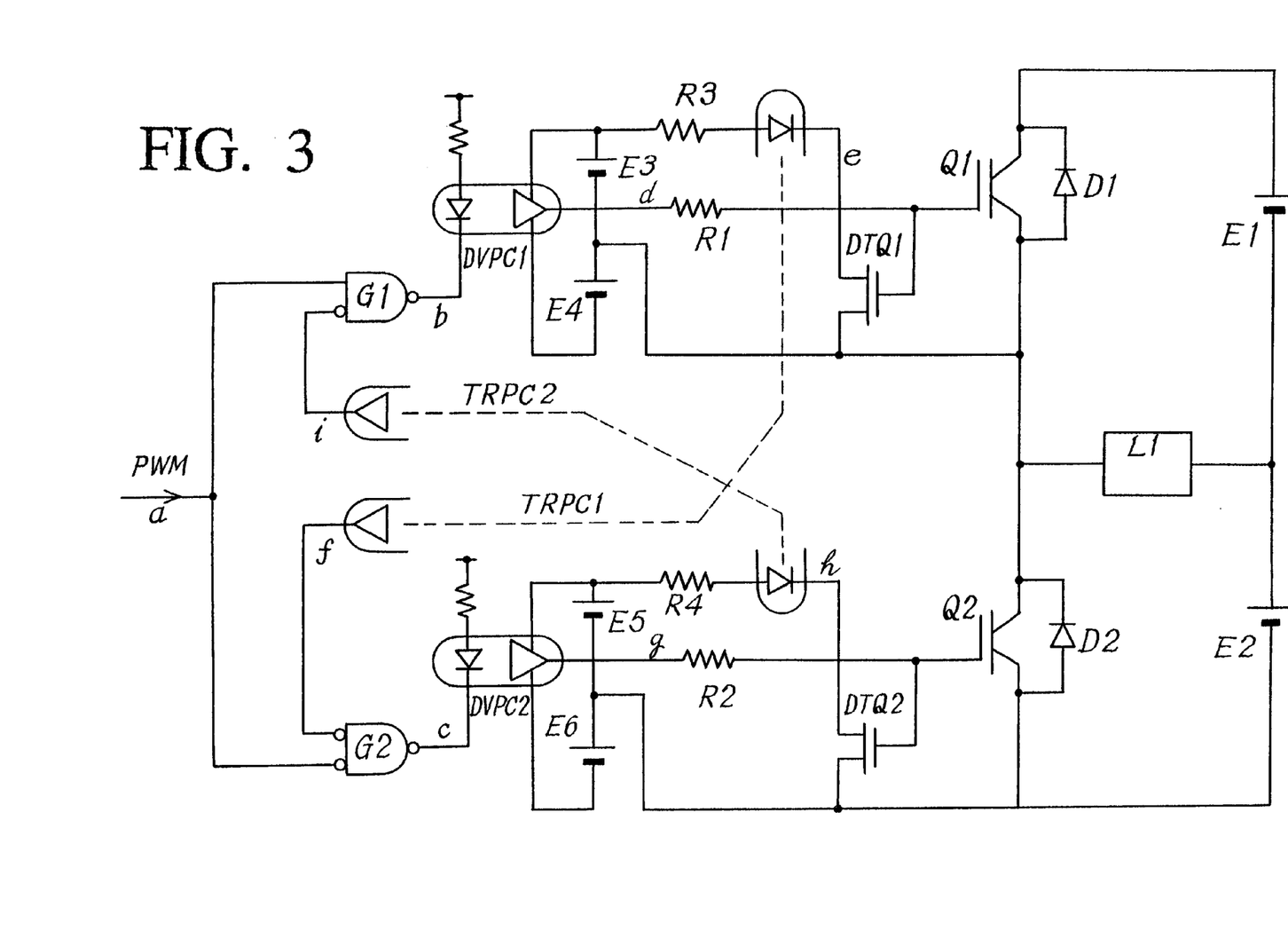
FIG. 3 is a block diagram of another arrangement according to the present invention in which photo-couplers are used for signal transmission.
Figures 4A, 4B, 4C, 4D, 4E, 4F:
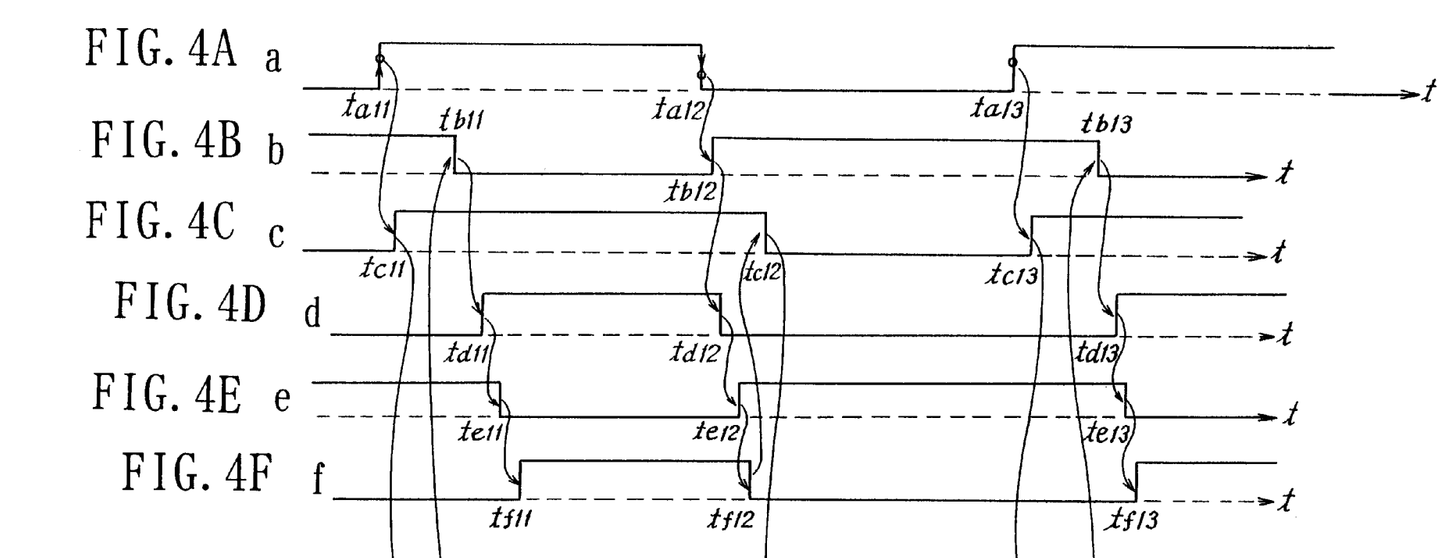
FIGS. 4A to 4I are time charts showing an operation of the arrangement, respectively.
Figures 4G, 4H, 4I:
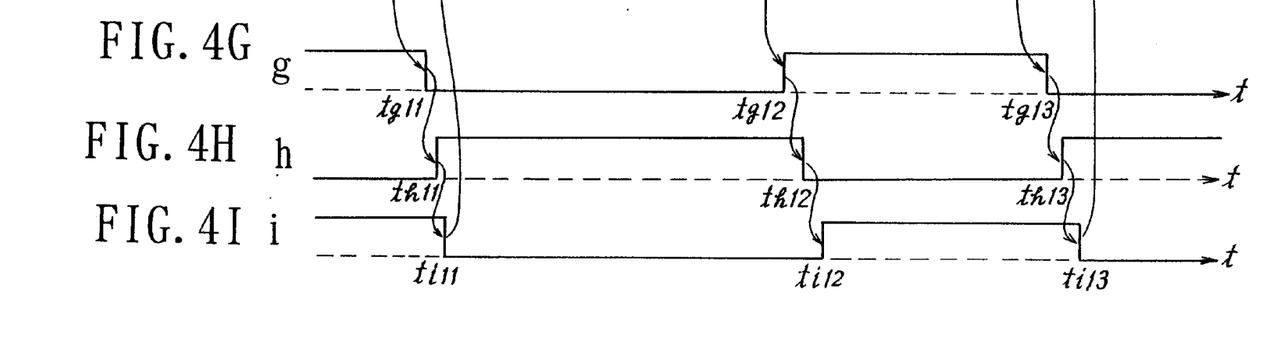

FIG. 3 illustrates a more detailed modification of the circuitry arrangement of FIG. 1 showing another embodiment of the present invention in which like functions or components are denoted by like numerals. The gate drive circuits are photo-couplers DVPC1 and DVPC2 for electrically isolating the PWM control signal a from the two drive circuits for the corresponding switching elements Q1 and Q2, respectively. The off-state detecting means DET1 and DET2 provided for their respective switching elements Q1 and Q2 are implemented by semiconductor switching elements DTQ1 and DTQ2, respectively. The on and off-states of the switching elements Q1 and Q2 can be detected automatically indirectly by measuring a boundary gate voltage (referred to as a threshold voltage hereinafter) Vdt which is enabled by the switching elements. It is noted that when the threshold voltage Vpw on the switching elements Q1 and Q2 are higher than Vdt, the detection of the on and off-states of the switching elements Q1 and Q2 will be increased in dependability. The output signals of the off-state detecting means DTQ1 and DTQ2 are then transmitted, via signal transferring means TRPC1 and TRPC2 composed of photo-couplers, to their corresponding gates G2 and G1 of the opposite arm, respectively.

An operation of the arrangement of FIG. 3 is explained by the time charts shown in FIGS. 4A to 4I. When the PWM signal a (FIG. 4A) rises to the high level at the timing ta11, the output signal c (FIG. 4C) of the gate G2 is shifted to the high level or an off-state, thus turning the output signal g (FIG. 4G) of the gate drive circuit DVPC2 from the high level to the low level at the timing tg11. This causes the off-state detecting means DTQ2 to detect the off-state of the switching element Q2 at the timing th11 lagged by substantially a time constant determined by a combination of a resistance R2 and a gate input capacitance Cg2 of the switching element Q2 and then the transferring means TRPC2 to deliver an off signal i (FIG. 4I) of the switching element Q2 to the gate G1 of the opposite arm which in turn delivers a low active signal b (FIG. 4B) to the gate drive circuit DVPC1 at the timing tb11. The gate drive circuit DVPC1 shifts the gate drive signal d (FIG. 4D) at the timing td11 to the high level for turning on the switching element Q1. Particularly, the switching element Q1 is turned on at a minimum delayed timing or td11 after the instant th11 when the off-state of the switching element Q2 has been detected. Accordingly, it is unnecessary to have a dead time for preventing the simultaneous turn-on actions of the two elements Q1 and Q2.

When the PWM signal a is shifted at the timing ta12 to the low level, the off signal b of the gate G1 turns to the high level, thus causing the output signal d of the gate drive circuit DVPC1 to turn at the timing td12 from the high level to the low level. Then, the off-state detecting means DTQ1 generates the off signal e indicative of the off-state of the switching element Q1 at the timing te12 lagged by the time constant determined by a combination of a resistance R1 and a gate input capacitance Cd1 of the switching element Q1, hence allowing the transferring means TRPC1 to deliver the off signal f (FIG. 4F) to the gate G2 of the opposite arm which sends, at the timing tc12, the low active signal c to the gate drive circuit VPC2. Accordingly, after an interval of transmission in the gate drive circuit DVPC2, the drive signal g (FIG. 4G) turns to the high level thus switching on the switching element Q2. More particularly, at the timing tg12 lagged after the timing te12 when the off-state of the switching element Q1 has been detected, the switching element Q2 is turned on, whereby such a dead time for preventing the simultaneous turn-on actions of the two elements Q1 and Q2 will be eliminated. It is feasible in the current technology of semiconductor elements that each of the intervals (expressed by the timings td11–th11, tg12–te12) falls within 500 nanoseconds while the action starting from the timing ta11 is repeated.

Figure 5:
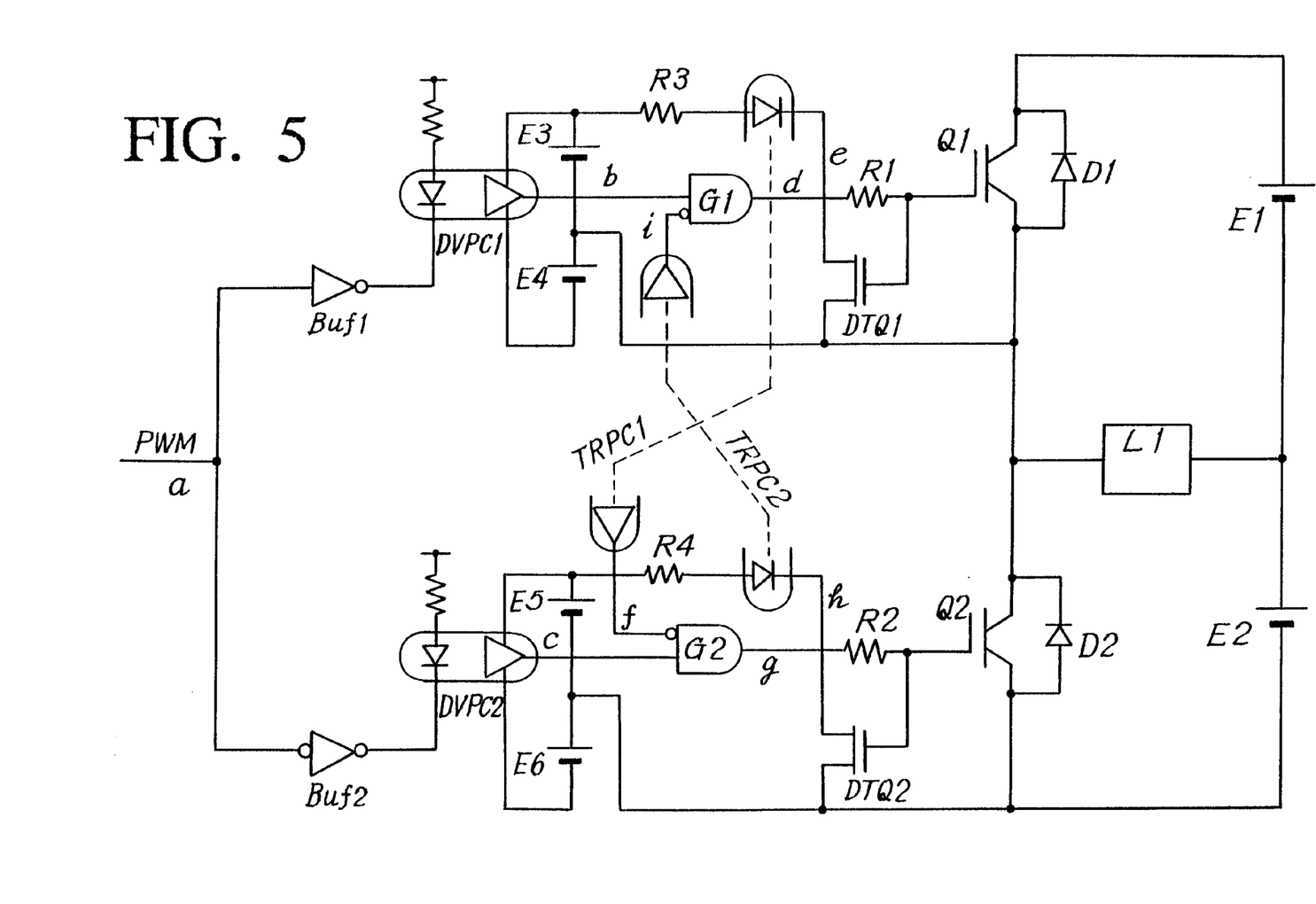
FIG. 5 is a block diagram of a further arrangement according to the present invention in which the period for signal transmission is decreased.

FIG. 5 illustrates another modification of the arrangement similar to those shown in FIGS. 1 and 3, showing a further embodiment of the present invention. While like functions and components are denoted by like numerals as those explained previously, the delay time encountered in signal transmission in the gate drive circuits DVPC1 and DVPC2 composed of photo-couplers is eliminated and each gate circuit which receives the off signal from the opposite arm is connected to the downstream or the switching element side of its corresponding gate drive circuit. This permits the interval from the turning-off of one switching element to the turning on of the opposite switching element to be minimized. More specifically, the PWM signal a inputs to two buffers Buf1 and Buf2 of which outputs are isolated by photo-couplers DVPC1 and DVPC2, respectively, which are connected to corresponding ones of paired inputs of the gates G1 and G2. Accordingly, the photo-coupler output signals b and c are identical in the timing of shift, and a time lag between the output signals b and c will be eliminated. Also, the interval of transmission from the signal a to the signals b and c will be minimized.

In particular, the gate G1 is connected between the gate drive circuit DVPC1 and the switching element Q1, and the gate G2 is connected between the gate drive circuit DVPC2 and the switching element Q2. The output signals of the gates G1 and G2 can directly control the on and off-states of the switching elements Q1 and Q2. Meanwhile, the off-states of the switching elements Q1 and Q2 are indirectly detected by the off-state detecting means DTQ1 and DTQ2, respectively.

Figure 6:
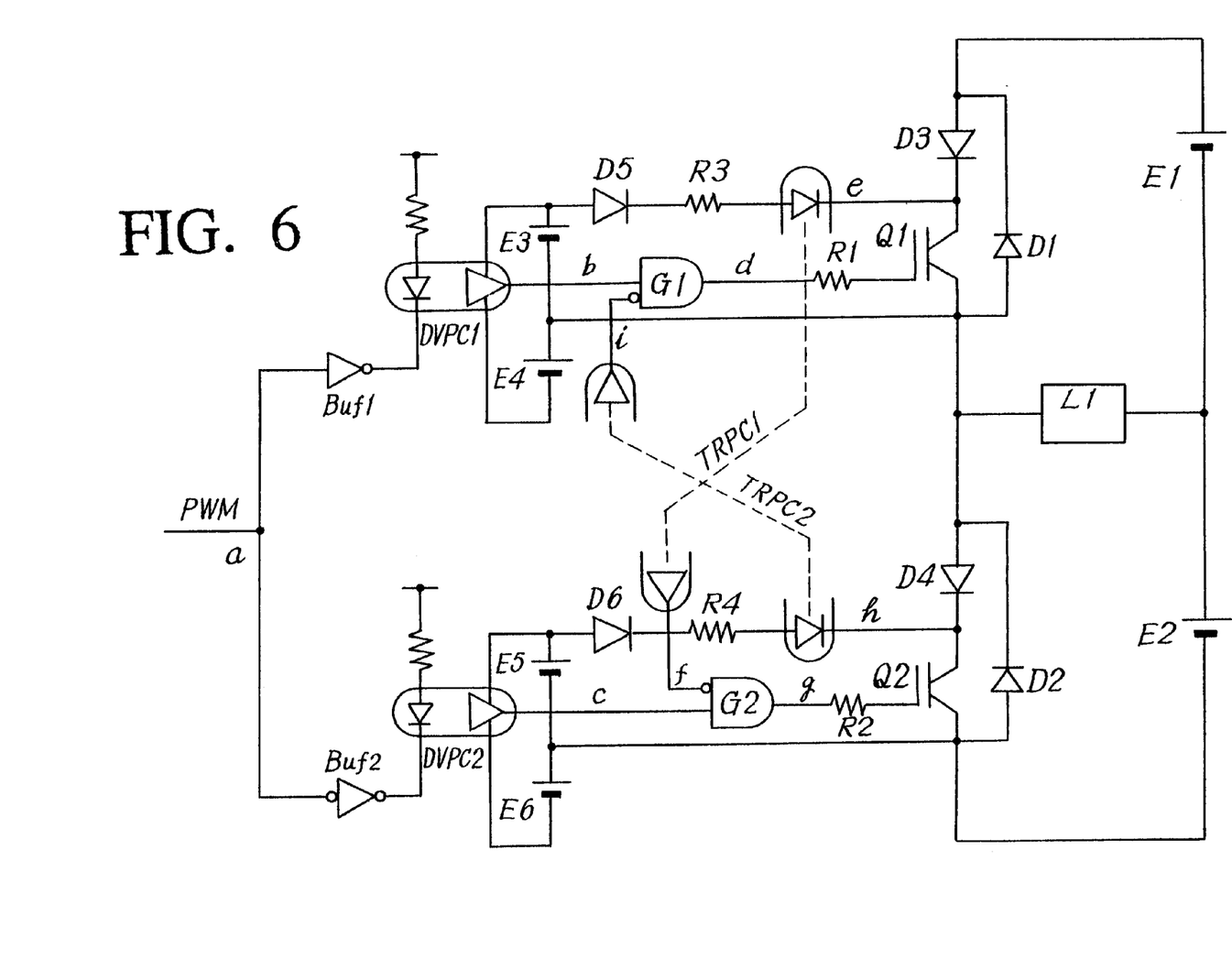
FIG. 6 is a block diagram of a still further arrangement according to the present invention in which the off-state can directly be detected.

FIG. 6 illustrates a further modification of the arrangement similar to FIGS. 1 and 5 showing a still further embodiment of the present invention where like functions and components are denoted by like numerals as those explained previously. While the off-state detecting means DTQ1 and DTQ2 are eliminated, the switching elements Q1 and Q2 are provided with the off-state detecting function. As the detection of the off-state is intrinsically carried out, its dependability will increase. To prevent the flow of primary side reverse currents in the TRPC1 and TRPC2, diodes D3 and D4 are connected in series to the switching elements Q1 and Q2, respectively, and diodes D5 and D6 are connected in series to the signal transferring means TRPC1 and TRPC2, respectively.

An operation in the arrangement of FIG. 6 is explained by the time charts shown in FIGS. 7A to 7I. When the PWM signal a (FIG. 7A) is shifted at the timing ta21 to the high level, the output signals b (FIG. 7B) and c (FIG. 7C) from the buffers Buf1 and Buf2 and the gate drive circuits DVPC1 and DVPC2 turn to the high level and the low level, respectively, at their corresponding timings tb21 and tc21. This causes the output signal g (FIG. 7G) of the gate G2 to turn to the low level at the timing tg21. At the timing th21 lagged by a time constant determined by the resistance R2 and the gate input capacitance Cg2 of the switching element Q2, the signal h (FIG. 7H) indicative of the off-state of the switching element Q2 is detected by the off-state detecting means DTQ2 (FIG. 5) or the switching element Q2 itself (FIG. 6) and is transmitted by the transferring means TRPC2 to the gate G1 of the opposite arm which then releases a low active signal i (FIG. 7I) at the timing ti21. This is followed by the timing td21 when the gate input signal d (FIG. 7D) is turned to the high level, thus switching on the switching element Q1. More specifically, at the timing td21, after the shortest interval from the timing th21 when the off-state of the switching element Q2 has been detected, the switching element Q1 can be turned on.

Figures 7A, 7B, 7C, 7D:
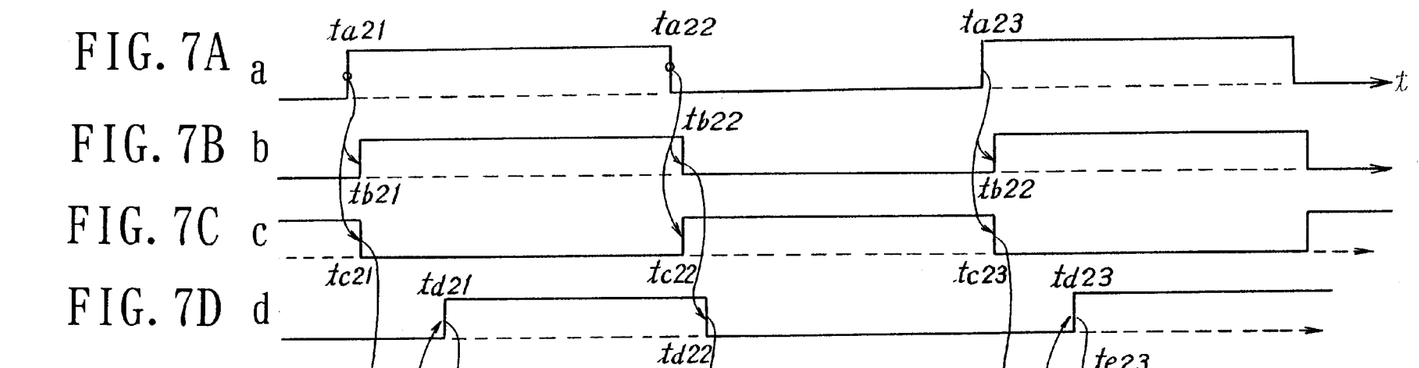
FIGS. 7A to 7I are time charts showing an operation of the arrangement, respectively.
Figures 7E, 7F:
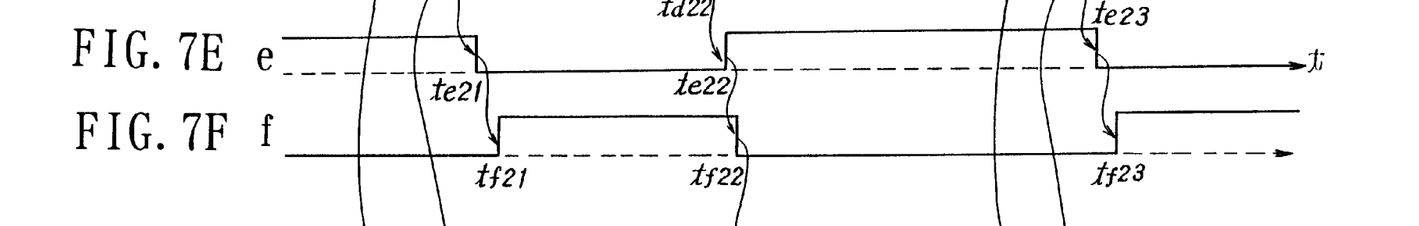
Figures 7G, 7H, 7I:
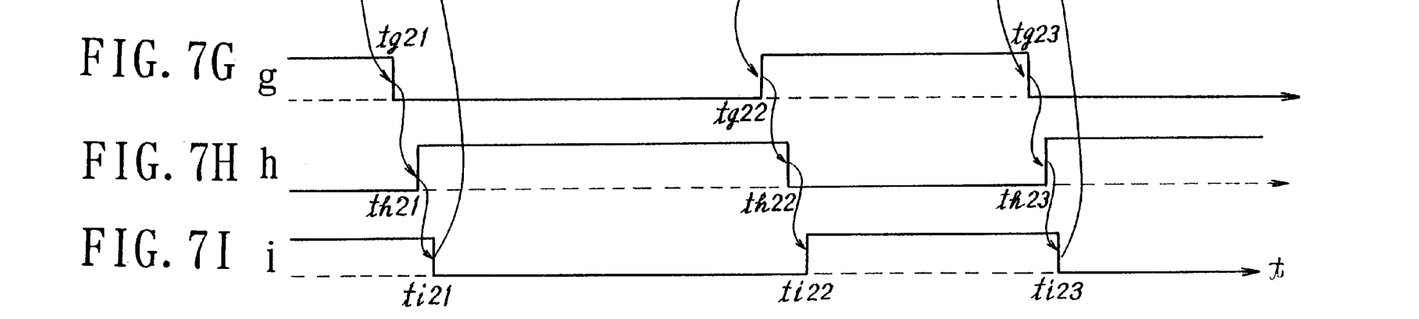

When the PWM signal a is shifted to the low level at the timing ta22, the two output signals b and c from the buffers Buf1 and Buf2 and the gate drive circuits DVPC1 and DVPC2 turn to the low level and the high level, respectively, at their corresponding timings tb22 and tc22. This causes the output signal d of the gate G1 to turn to the low level at the timing td22. At the timing te22 lagged by the time constant determined by a combination of the resistance R1 and the gate input capacitance Cd1 of the switching element Q1, the off signal e (FIG. 7E) indicative of the off-state of the switching element Q1 is detected by the off-state detecting means DTQ1 (FIG. 5) or the switching element Q1 itself and is transmitted by the transferring means TRPC1 to the gate G2 of the opposite arm which then releases a low active signal f at the timing tf22. This is followed by tg22 when the gate input signal g is turned to the high level, thus switching on the switching element Q2.

More specifically, at the timing tg22 after the shortest interval from the timing te22, when the off-state of the switching element Q1 has been detected, the switching element Q2 can be turned on. Then, the action starting from the timing ta21 is repeated. It is feasible in the current technology of semiconductor elements that each of the intervals (expressed by the timings td21–th21, tg22–te22) falls within 100 nanoseconds. Also, since the off-state is detected by directly examining the outputs of the switching elements Q1 and Q2 in the circuitry arrangement shown in FIG. 6, both the switching elements Q1 and Q2 will never be turned on at the same time, thus contributing to the steadiness of the PWM switching action.

Figure 8:
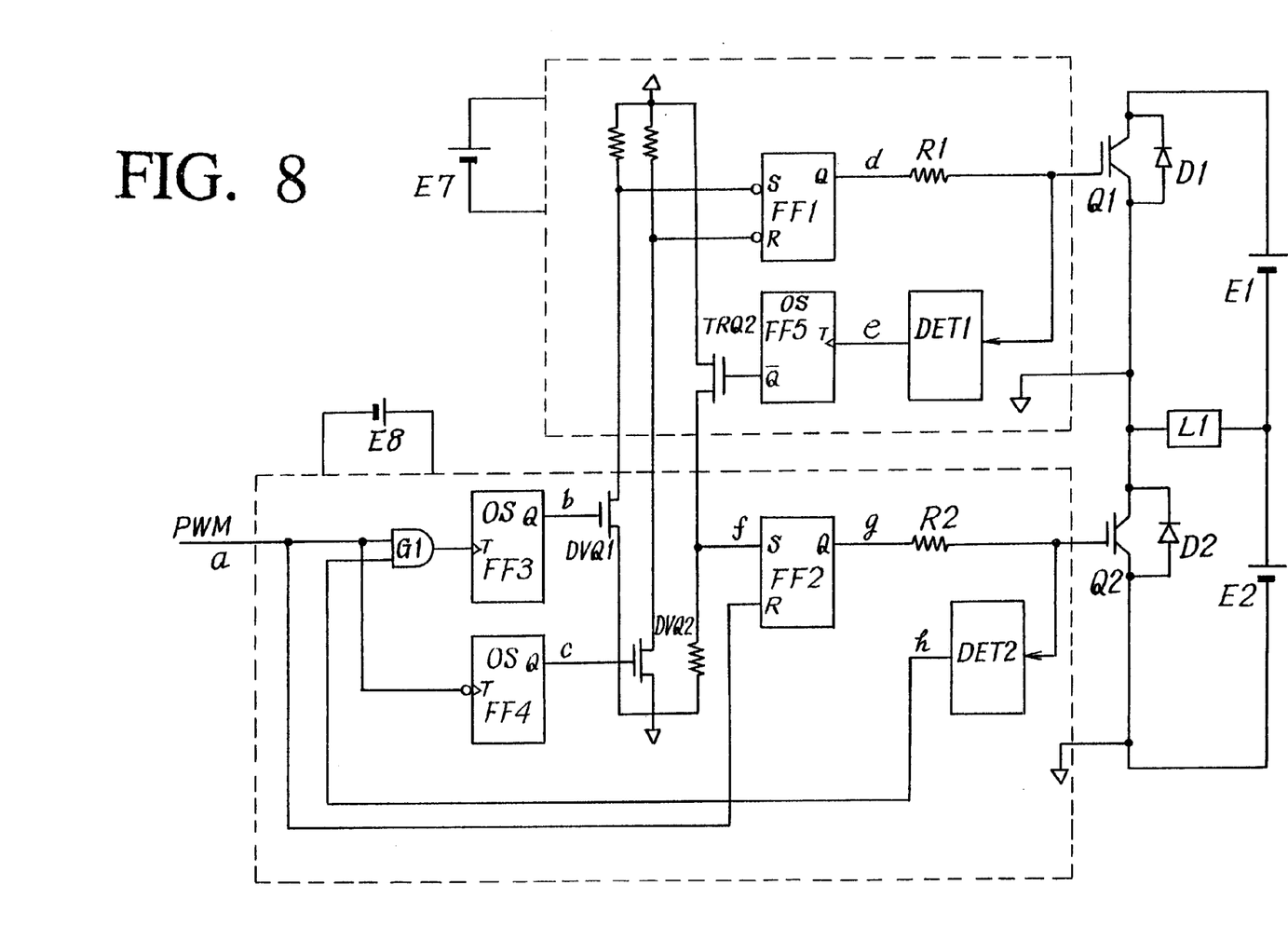
FIG. 8 is a block diagram of a still further arrangement according to the present invention in which all the components are assembled in a solid-state form.
Figures 9A, 9B:
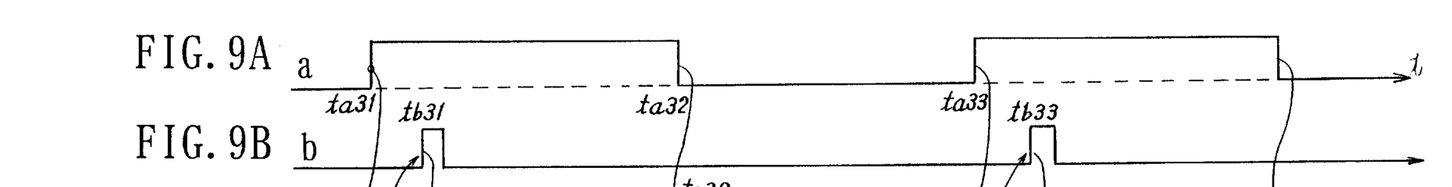
FIGS. 9A to 9H are time charts showing an operation of the arrangement, respectively.
Figures 9C, 9D:
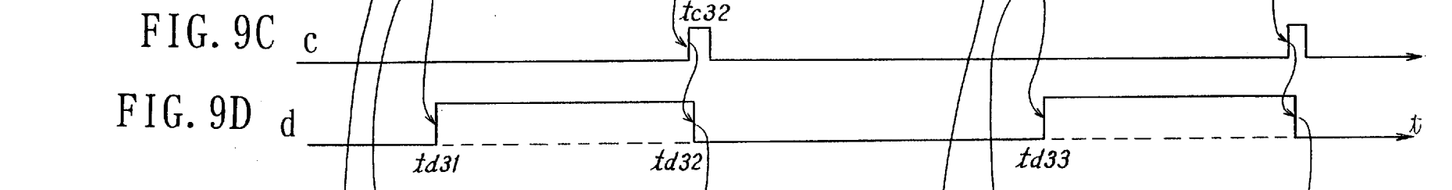
Figure 9E:
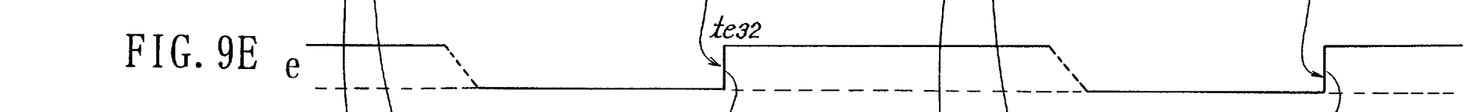
Figures 9F, 9G:
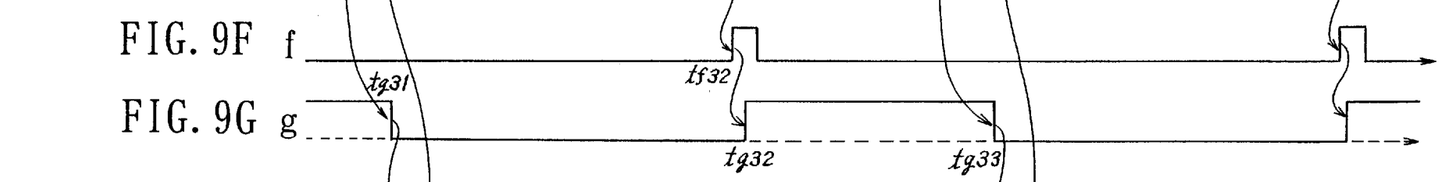
Figure 9H:
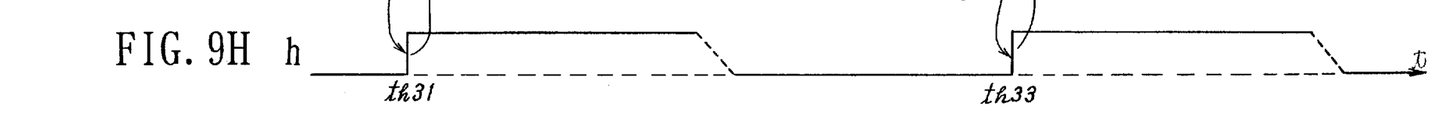

FIG. 8 illustrates a further modification of the arrangement similar to FIGS. 1 and 5 showing a still further embodiment of the present invention where like functions and components are denoted by like numerals as those explained previously. In particular, the photo-couplers which are rather low in the signal transfer speed are substituted by semiconductor devices. The solid-state arrangement of the circuit will ensure the stable action of the high-speed switching elements and the semiconductor integrated structure of the circuit will be simplified in the manufacturing process. More specifically, the PWM signal a is supplied to one of two inputs of the gate G1 in the low-side voltage circuit driven by a power source E8, to the reset input of a reset-set (RS) flip-flop 2 (the flip-flop abbreviated to "FF" hereinafter), and to the input of a one-shot FF4 which is activated by the falling edge of the PWM signal a. The output of the FF4 is connected via a voltage level changing means DVQ2 to the reset input of an RSFF1 driven by a power source E7 of the high-side voltage circuit. The output of the FF2 is connected via a resistor R2 to the switching element Q2, and its gate voltage level is monitored by an off-state detecting means DET2.

When the output signal drops to a level which is lower than a predetermined voltage level, an off-state detection signal f of the off-state detecting means DET2 is delivered to the other input of the gate G1. The output of the gate G1 is connected via a one-shot FF3 to a voltage level changing means DVQ1 which is connected at its output to the set input of an RSFF1. The output of the FF1 is connected via a resistor R1 to the switching element Q1 and also to an off-state detecting means DET1 for monitoring the gate voltage to the switching element Q1. When the gate voltage to the switching element Q1 drops to a level which is lower than a predetermined level, an off-state detection signal e is supplied to a one-shot FF5 which in turn delivers an inverse output signal *Q via the voltage level changing means TRQ2 to the set input of the RSFF2. It is noted that the FF3, FF4 and FF5 are employed of one-shot type since they consume smaller power in the signal transmission. It is also apparent for those skilled in the art to pick up the input signals to the off-state detecting means DET1 and DET2 from the outputs of the switching elements Q1 and Q2 for directly examining the off-state.

An operation in the arrangement of FIG. 8 is explained by the time charts shown in FIGS. 9A to 9H. When the PWM signal a (FIG. 9A) is shifted to the high level at the timing ta31, the FF2 is reset and its output signal g (FIG. 9G) turns to the low level at the timing tg31. Then, at the timing th31 lagged by substantially a time constant determined by the resistance of the resistor R2 and the gate input capacitance Cg2, the off-state detecting means DET2 generates and delivers an off signal h (FIG. 9H) indicative of the off-state of the switching element Q2 to the gate G1 of the opposite arm. The gate G1 thus drives the one-shot FF3 to transmit a one-shot output signal b (FIG. 9B) via the voltage level changing means DVQ1 to the set input of the FF1 which in turn shifts its output signal d (FIG. 9D) to the high level for turning on the switching element Q2. More specifically, at the timing td31 after the shortest interval, which is required for turning on the gate 1, the FF3, and the voltage level changing means DVQ1, from the timing th31 when the off-state of the switching element Q2 has been detected, the switching element Q1 can be turned on.

When the PWM signal a is shifted to the low level at the timing ta32, the two output signal c (FIG. 9C) from the one-shot FF4 causes the voltage level changing means DVQ2 to reset the FF1. Thus, the output signal d (FIG. 9D) of the FF1 is turned to the low level at the timing tg32. At the timing te32 lagged by the time constant determined by the resistance of the resistor R1 and the gate input capacitance Cd1 of the switching element Q1, the off signal e indicative of the off-state of the switching element Q1 is generated by the off-state detecting means DET1 and is transmitted to the one-shot FF5 which in turn generates and delivers a trigger pulse signal f (FIG. 9F) to the set input of the FF2 in the opposite arm at the timing tf32. This causes the gate input signal g to turn to the high level at tg32 for switching on the switching element Q2. More specifically, at the timing tg32 after the shortest interval which is required for turning on the FF5 and the TRQ2 from the timing te32 when the off-state of the switching element Q1 has been detected, the switching element Q2 can be turned on.

The action starting from the timing ta31 is then repeated. It is feasible in the current technology of semiconductor devices that each of the intervals (expressed by the timings td31–th31, tg32–te32) is decreased from a conventional range between 3 and 6 microseconds to less than 50 nanoseconds. The circuitry arrangement of FIG. 8 can be implemented by an array of semiconductor devices and can be easily constructed to a package form by a known manufacturing process without using photo-couplers. It is also understood by those skilled in the art that the foregoing PWM operation explained by FIGS. 1 to 9 is not limited to a single phase, but the present invention may successfully be applied to two-phase, three-phase, and other multi-phase PWM operations.

As set forth above, the method and the apparatus for reducing the dead time in a PWM converter allows the off-state detecting means connected to a corresponding switching element in one arm to be monitored directly or indirectly so that its detection of the off-state of the switching element turns on another switching element in the opposite arm. Accordingly, the dead time is reduced certainly and safely from a conventional range (e.g. between 3 and 6 microseconds) which is determined unconditionally and perpetually as small as 50 to 500 nanoseconds.

This permits favorable linear control under a very small power which is hardly conducted in a common PWM inverter. In particular, the PWM control on a motor can be made smoothly without generating unwanted noise or pulsation throughout a range of very small power. In a class-D power amplifier of PWM drive type provided at the output stage in an audio apparatus, the present invention successfully attenuates distortion and noise which are disadvantageously greater than in the other types of power amplifiers such as class-A, class-B and class-C. When the switching elements and the off-state detecting means of the present invention are made in a solid-state form and assembled in a sealed package, their PWM controlling operation will be increased in the safety and the certainty.

What is claimed is:

1. A dead time reducing apparatus for use in a PWM inverter comprising an upper arm having a first power switching element and a lower arm having a second power switching element, said apparatus comprising:
   a first off-state detecting means provided in the upper arm and connected to the first power switching element for detecting an off-state of the first power switching element;
   a second off-state detecting means provided in the lower arm and connected to the second power switching element for detecting an off-state of the second power switching element;
   a first gate means provided in the upper arm for receiving an off-state detection signal fed back from said second off-state detection means and for generating a turn-on signal for the first power switching element; and
   a second gate means provided in the lower arm for receiving an off-state detection signal fed back from said first off-state detection means and for generating a turn-on signal for the second power switching element.

2. A dead time reducing apparatus as claimed in claim 1, wherein said first off-state detecting means judges the off-state of the first power switching element indirectly from a high/low level of a gate signal supplied to the first power switching element, and wherein said second off-state detecting means judges the off-state of the second power switching element indirectly from a high/low level of a gate signal supplied to the second power switching element.

3. A dead time reducing apparatus as claimed in claim 1, wherein said first off-state detecting means judges the off-state of the first power switching element directly from a level of an output signal of the first power switching element, and wherein said second off-state detecting means judges the off-state of the second power switching element directly from a level of an output signal of the second power switching element.

4. A dead time reducing apparatus as claimed in claim 2, wherein the off-state detection signal fed back from said first off-state detection means is transmitted and received via a first isolating means by which the off-state detection signal is isolated from the power switching elements, and wherein the off-state detection signal fed back from said second off-state detection means is transmitted and received via a second isolating means by which the off-state detection signal is isolated from the power switching elements.

5. A dead time reducing apparatus as claimed in claim 2, wherein the off-state detection signal fed back from said first off-state detection means is transmitted and received via a first non-isolating means by which the off-state detection signal is not isolated from the power switching elements, and wherein the off-state detection signal fed back from said second off-state detection means is transmitted and received via a second non-isolating means by which the off-state detection signal is not isolated from the power switching elements.

6. A dead time reducing apparatus as claimed in claim 4, wherein each of said first and second isolating means is a photo-coupler and/or a pulse transformer.

7. A dead time reducing apparatus as claimed in claim 5 wherein each of said first and second non-isolating means is a monolithic semiconductor device.

8. A dead time reducing apparatus as claimed in claim 1, wherein said first and second off-state detecting means is located in the first and second power switching elements, respectively.

9. A method of reducing a dead time in a PWM inverter comprising an upper arm and a lower arm each having a power switching element and a gate, said method comprising:

judging an off-state of the power switching element in a first one of the upper and lower arms;

transmitting an off-state detection signal, indicative of the off-state judged for the power switching element in the first one of the upper and lower arms, to an input of the gate in a second one of the upper and lower arms; and generating and delivering a turn-on signal to the power switching element in the second one of the upper and lower arms in response to the off-state detection signal received at the input of the gate in the second one of the upper and lower arms.

10. A method of reducing a dead time in a PWM inverter as claimed in claim 9, wherein said judging the off-state of the power switching element in the first one of the upper and lower arms comprises judging the off-state of the power switching element in the first one of the upper and lower arms indirectly from a high/low level of a gate signal supplied to the power switching element.

11. A method of reducing a dead time in a PWM inverter as claimed in claim 9, wherein said judging the off-state of the power switching element in the first one of the upper and lower arms comprises judging the off-state of the power switching element in the first one of the upper and lower arms directly from a high/low level of a gate signal supplied to the power switching element.

12. A method of reducing a dead time in a PWM inverter as claimed in claim 10, wherein said transmitting the off-state detection signal comprises transmitting the off-state detection signal via a signal isolating means.

13. A method of reducing a dead time in a PWM inverter as claimed in claim 10, wherein said transmitting the off-state detection signal comprises transmitting the off-state detection signal via a signal non-isolating means.

14. A method of reducing a dead time in a PWM inverter as claimed in claim 12, wherein the signal isolating means is a photo-coupler and/or a pulse transformer.

15. A method of reducing a dead time in a PWM inverter as claimed in claim 13, wherein the signal non-isolating means is a monolithic semiconductor device.

16. A method of reducing a dead time in a PWM inverter as claimed in claim 9, wherein a means for performing said judging the off-state of the power switching element in the first one of the upper and lower arms is located in the power switching element in the first one of the upper and lower arms.

* * * * *